(12) United States Patent
You et al.

(10) Patent No.: US 11,742,206 B2
(45) Date of Patent: Aug. 29, 2023

(54) LATERALLY DIFFUSED METAL OXIDE SEMICONDUCTOR DEVICE AND METHOD FOR MANUFACTURING THE SAME

(71) Applicant: Silergy Semiconductor Technology (Hangzhou) LTD, Hangzhou (CN)

(72) Inventors: Budong You, Hangzhou (CN); Hui Yu, Hangzhou (CN); Meng Wang, Hangzhou (CN); Yicheng Du, Hangzhou (CN); Chuan Peng, Hangzhou (CN); Xunyi Song, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 118 days.

(21) Appl. No.: 17/193,234

(22) Filed: Mar. 5, 2021

(65) Prior Publication Data
US 2021/0193815 A1 Jun. 24, 2021

Related U.S. Application Data

(63) Continuation of application No. 16/411,318, filed on May 14, 2019, now Pat. No. 10,998,416.

(30) Foreign Application Priority Data

May 25, 2018 (CN) .......................... 201810545876.2

(51) Int. Cl.
*H01L 21/265* (2006.01)
*H01L 29/06* (2006.01)
(Continued)

(52) U.S. Cl.
CPC .. *H01L 21/26513* (2013.01); *H01L 21/76202* (2013.01); *H01L 29/063* (2013.01);
(Continued)

(58) Field of Classification Search
CPC ......... H01L 21/26513; H01L 21/76202; H01L 29/063; H01L 29/0653; H01L 29/0865; H01L 29/0882; H01L 29/1095; H01L 29/66681; H01L 29/7823; H01L 29/0634; H01L 29/66613; H01L 29/7816
See application file for complete search history.

(56) References Cited

U.S. PATENT DOCUMENTS

| 6,559,504 B2 * | 5/2003 | Nishibe ............. H01L 29/66674 257/E29.066 |
| 7,018,899 B2 | 3/2006 | Sung |

(Continued)

*Primary Examiner* — Eduardo A Rodela

(57) ABSTRACT

A laterally diffused metal oxide semiconductor device can include: a well region having a second doping type; a reduced surface field effect layer of a first doping type formed by an implantation process in a predetermined region of the well region, where a length of the reduced surface field effect layer is less than a length of the well region; a body region of the first doping type extending from a top surface of the well region into the well region; a drain portion of the second doping type extending from the top surface of the well region into the well region; and an insulating structure located between the body region and the drain portion, at least a portion of the insulating structure is located on the top surface of the well region.

12 Claims, 9 Drawing Sheets

(51) Int. Cl.
  *H01L 21/762* (2006.01)
  *H01L 29/08* (2006.01)
  *H01L 29/10* (2006.01)
  *H01L 29/40* (2006.01)
  *H01L 29/423* (2006.01)
  *H01L 29/49* (2006.01)
  *H01L 29/66* (2006.01)
  *H01L 29/78* (2006.01)

(52) U.S. Cl.
  CPC ...... *H01L 29/0653* (2013.01); *H01L 29/0865* (2013.01); *H01L 29/0882* (2013.01); *H01L 29/1095* (2013.01); *H01L 29/402* (2013.01); *H01L 29/404* (2013.01); *H01L 29/4238* (2013.01); *H01L 29/42368* (2013.01); *H01L 29/4983* (2013.01); *H01L 29/66674* (2013.01); *H01L 29/66681* (2013.01); *H01L 29/7823* (2013.01)

(56) References Cited

U.S. PATENT DOCUMENTS

| | | | |
|---|---|---|---|
| 7,074,659 B2 | 7/2006 | Zuniga et al. | |
| 7,230,302 B2 | 6/2007 | Lotfi et al. | |
| 7,868,378 B1* | 1/2011 | Zuniga | H01L 29/7816 |
| | | | 438/236 |
| 7,888,222 B2 | 2/2011 | You et al. | |
| 7,981,739 B1 | 7/2011 | You et al. | |
| 7,999,318 B2 | 8/2011 | Zuniga et al. | |
| 8,063,444 B2 | 11/2011 | Chang | |
| 8,119,507 B2 | 2/2012 | You | |
| 8,293,612 B2 | 10/2012 | Lee | |
| 8,319,283 B2 | 11/2012 | Min et al. | |
| 8,431,450 B1* | 4/2013 | Zuniga | H01L 29/7816 |
| | | | 438/316 |
| 8,431,990 B2* | 4/2013 | Lee | H01L 29/0634 |
| | | | 257/213 |
| 8,455,340 B2 | 6/2013 | Zuniga et al. | |
| 8,574,973 B1 | 11/2013 | You et al. | |
| 8,581,344 B2 | 11/2013 | Liu | |
| 8,716,790 B2 | 5/2014 | Lotfi et al. | |
| 8,716,795 B2 | 5/2014 | You | |
| 8,912,600 B2 | 12/2014 | You | |
| 9,299,831 B2* | 3/2016 | Matsuda | H01L 29/66659 |
| 10,121,894 B2* | 11/2018 | Eikyu | H01L 29/42312 |
| 10,229,993 B2* | 3/2019 | Xia | H01L 29/42376 |
| 10,388,741 B2* | 8/2019 | Mori | H01L 29/0696 |
| 10,461,182 B1* | 10/2019 | Edwards | H01L 29/0882 |
| 10,529,804 B2* | 1/2020 | Cai | H01L 29/66598 |
| 11,094,818 B2* | 8/2021 | Takeuchi | H01L 29/7816 |
| 10,903,340 B2 | 10/2021 | You et al. | |
| 11,195,909 B2* | 12/2021 | Parthasarathy | H01L 29/7819 |
| 2003/0038316 A1* | 2/2003 | Tsuchiko | H01L 29/7816 |
| | | | 257/E29.066 |
| 2006/0113625 A1* | 6/2006 | Bude | H01L 29/7835 |
| | | | 257/493 |
| 2007/0069308 A1* | 3/2007 | Ko | H01L 29/402 |
| | | | 438/301 |
| 2010/0052052 A1 | 3/2010 | Lotfi et al. | |
| 2010/0065909 A1 | 3/2010 | Ichijo | |
| 2013/0020632 A1 | 1/2013 | Disney | |
| 2014/0312415 A1 | 10/2014 | Furuhata | |
| 2014/0320174 A1 | 10/2014 | Lu et al. | |
| 2015/0380398 A1 | 12/2015 | Makkikarjunaswamy | |
| 2017/0263761 A1 | 9/2017 | Hu et al. | |
| 2019/0363185 A1 | 11/2019 | You et al. | |
| 2019/0363186 A1 | 11/2019 | You et al. | |

* cited by examiner

LATERALLY DIFFUSED METAL OXIDE SEMICONDUCTOR DEVICE AND METHOD FOR MANUFACTURING THE SAME

RELATED APPLICATIONS

This application is a continuation of the following application, U.S. patent application Ser. No. 16/411,318, filed on May 14, 2019, and which is hereby incorporated by reference as if it is set forth in full in this specification, and which also claims the benefit of Chinese Patent Application No. 201810545876.2, filed on May 25, 2018, which is incorporated herein by reference in its entirety.

FIELD OF THE INVENTION

The present invention generally relates to semiconductor devices, and more particularly to laterally diffused metal oxide semiconductor devices and associated methods.

BACKGROUND

Voltage regulators, such as DC-to-DC voltage converters, are used to provide stable voltage sources for various electronic systems. Efficient DC-to-DC converters are particularly useful for battery management in low power devices (e.g., laptop notebooks, cellular phones, etc.). A switching voltage regulator can generate an output voltage by converting an input DC voltage into a high frequency voltage, and then filtering the high frequency input voltage to generate the output DC voltage. For example, the switching regulator can include a switch for alternately coupling and decoupling an input DC voltage source (e.g., a battery) to a load (e.g., an integrated circuit [IC], a light-emitting diode [LED], etc.). An output filter, can include an inductor and a capacitor, and may be coupled between the input voltage source and the load to filter the output of the switch, and thus provide the output DC voltage. A controller (e.g., a pulse-width modulator, a pulse frequency modulator, etc.) can control the switch to maintain a substantially constant output DC voltage. Lateral double-diffused metal oxide semiconductor (LDMOS) transistors may be utilized in switching regulators due to their performance in terms of a tradeoff between their specific on-resistance ($R_{dson}$) and drain-to-source breakdown voltage ($BV_{d\_s}$).

DETAILED DESCRIPTION

Figure 1:
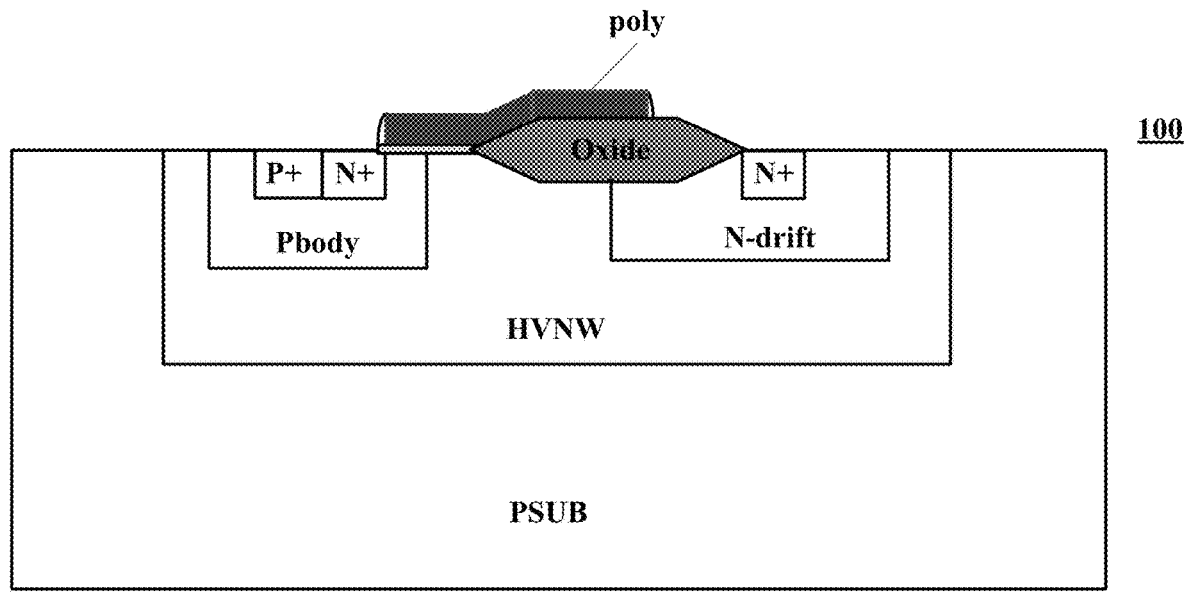
FIG. 1 is a cross-sectional view of an example laterally diffused metal oxide semiconductor device.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor devices are generally manufactured using two complex manufacturing processes: front-end manufacturing and back-end manufacturing. Front-end manufacturing may involve the formation of a plurality of die on the surface of a semiconductor wafer. Each die on the wafer may contain active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components can be formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist may be removed, leaving behind a patterned layer. Alternatively, some types of materials can be patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface may be used to produce smaller and more densely packed active and passive components. Planarization can be used to remove material from the surface of the wafer and produce a uniformly flat surface. Planarization can involve polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer may be singulated using a laser cutting tool or saw blade. After singulation, the individual die are mounted to a package substrate that includes pins or contact pads for interconnection with other system components. Contact pads formed over the semiconductor die can then be connected to contact pads within the package. The electrical connections can be made with solder bumps, stud bumps, conductive paste, or wire bonds, as a few examples. An encapsulant or other molding material may be deposited over the package to provide physical support and electrical isolation. The finished package can then be inserted into an electrical system and the functionality of the semiconductor device is made available to the other system components.

Referring now to FIG. 1, shown is a cross-sectional view of an example laterally diffused metal oxide semiconductor device. In this particular example, laterally diffused metal oxide semiconductor device 100 can include P-type substrate PSUB, high voltage N-type well region HVNW in P-type substrate PSUB, P-type body region Pbody, and N-type drift region N-drift in high voltage N-type well region HVNW. For example, a source region N+ and a drain region N+ can respectively be formed in P-type body region Pbody and N-type drift region N-drift. A body contact region P+ may also be formed in the P-type body region Pbody and be arranged in contact with the source region N+. A gate dielectric layer can be arranged on a surface of semiconductor device 100 and may be adjacent to the source region. Thick oxide layer Oxide between the gate dielectric layer and the drain region can be arranged on the surface of semiconductor device 100. A gate conductor poly can cover the gate dielectric layer and extends to the thick oxide layer Oxide.

In order to improve the breakdown voltage (BV) of semiconductor device 100, the doping concentration of N-type drift region N-drift may need to be reduced. However, in order to reduce on-resistance (Rdson) of semiconductor device 100, the doping concentration of N-type drift region N-drift may need to be increased such that the voltage withstanding performance and the on-resistance performance of semiconductor device 100 are limited by each other. Further, in order to improve breakdown voltage BV, increasing thickness of the thick oxide layer Oxide and increasing the distance between the P-type body region and the drain region may cause an increase in on-resistance Rdson of semiconductor device 100, which may be disadvantageous for improving the overall performance of semiconductor device 100.

In one embodiment, a laterally diffused metal oxide semiconductor device can include: (i) a well region having a second doping type; (ii) a reduced surface field effect layer of a first doping type formed by an implantation process in a predetermined region of the well region, where a length of the reduced surface field effect layer is less than a length of the well region; (iii) a body region of the first doping type extending from a top surface of the well region into the well region; (iv) a drain portion of the second doping type extending from the top surface of the well region into the well region; and (v) an insulating structure located between the body region and the drain portion, at least a portion of the insulating structure is located on the top surface of the well region, where along a depth direction from the top surface of the well region to a bottom surface of the well region, a lower surface of the body region and a lower surface of the drain portion are not lower than an upper surface of the reduced surface field effect layer.

Figure 2:
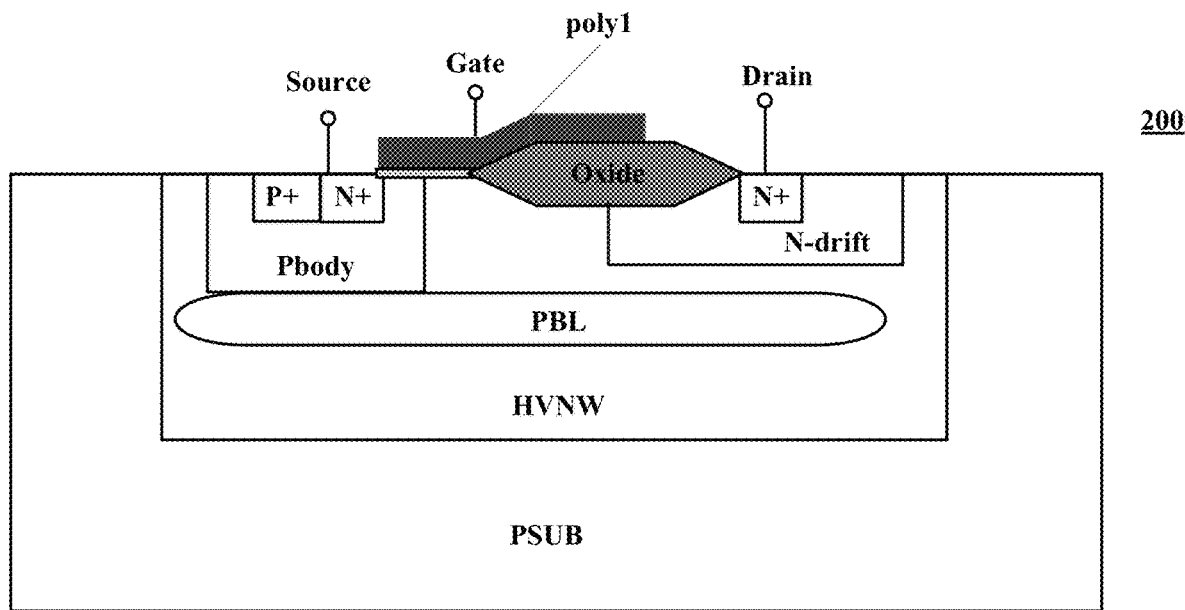
FIG. 2 is a cross-sectional view of a first example laterally diffused metal oxide semiconductor device, in accordance with embodiments of the present invention.

Referring now to FIG. 2, shown is a cross-sectional view of a first example laterally diffused metal oxide semiconductor device, in accordance with embodiments of the present invention. In this particular example, semiconductor device 200 can include a base layer, a reduced surface field effect layer having a first doping type, and a drain portion. The reduced surface field effect layer may be formed by a ion implantation process in a predetermined region of the base layer. Along a depth direction from the top surface of the base layer to a bottom surface of the base layer, a lower surface of the drain portion may not be lower than an upper surface of the reduced surface field effect layer. For example, the drain portion can include a drift region having a second doping type and a drain region having the second doping type located in the drift region, and a lower surface of the drift region may not be lower than an upper surface of the reduced surface field effect layer.

In other examples, the drain portion may include only a drain region, and a lower surface of the drain region may not be lower than an upper surface of the reduced surface field effect layer. The drift region can be located in the base layer and located above the reduced surface field effect layer. Further, the first spacing distance between the upper surface of the reduced surface field effect layer and the lower surface of the drift regions may be greater than zero; that is, the lower surface of the drift region may not be in contact with the upper surface of the reduced surface field effect layer.

In semiconductor device 200, the first doping type may, e.g., be a P-type, and the second doping type may, e.g., be an N-type. Of course, in other examples, the first doping type may be an N-type, and the second doping type may be a P-type. The base layer can be composed of P-type substrate PSUB and N-type high voltage well region HVNW located in substrate PSUB. In other examples, the base layer may also be composed only of a semiconductor substrate. For example, a length of the reduced surface field effect layer can be less than a length of the N-type high voltage well region, N-type drift region N-drift is located in high voltage well region HVNW, and the breakdown voltage BV of semiconductor device 200 may be adjusted by changing the doping concentration of N-type drift region N-drift. The doping concentration of N-type drain region N+ can be greater than that of N-type drift region N-drift, and drain region N+ may be electrically connected with drain electrode Drain.

The reduced surface field effect layer can assist in depleting the drift region such that when the drift region has a higher doping concentration, it can still be quickly depleted to reduce the surface electric field of semiconductor device 200. Thus, semiconductor device 200 may have both low on-resistance Rdson and high breakdown voltage BV. In order to further reduce on-resistance Rdson of semiconductor device 200, the first spacing distance between the reduced surface field effect layer and the drift region can be set to be greater than zero. That is, there may be a certain space between the reduced surface field effect layer and the drift region to supply electrons flow through. In addition, in order to better adjust the voltage withstanding characteristic of semiconductor device 200, the first spacing distance may be adjusted according to the doping concentration of the drift region. The greater the doping concentration of the drift region, the more the auxiliary depletion of the reduced surface field effect layer may be needed, then the smaller the first spacing distance is, and vice versa. In semiconductor device 200, the reduced surface field effect layer may be a P-type buried layer PBL formed in N-type high voltage well region HVNW.

Semiconductor device 200 may also include a body region of a first doping type and a source region located in the body region and having a second doping type. A lower surface of the body region may not be lower than an upper surface of the reduced surface field effect layer, and the lower surface of the body region may be in contact with or not in contact with the upper surface of the reduced surface field effect layer. For example, along the depth direction, the body region can be located in the base layer and located above the reduced surface field effect layer. In other examples, along the depth direction, the reduced surface field effect layer may not be disposed below the body region. In order to provide sufficient dopant of first type (corresponding to the first doping type, e.g., the first doping type is P-type, and the dopant of first type is P-type dopant) at a position closer to the surface of semiconductor device 200, the second spacing distance between the upper surface of the reduced surface field effect layer and the lower surface of the body region may be set to be less than or equal to the first spacing distance, in order to better assist in deplete the region near the drain region to reduce the surface electric field of the region.

In semiconductor device 200, the lower surface of the body region may be closer to the upper surface of the reduced surface field effect layer than the lower surface of the drift region, body region Pbody can be P-type doped, and N-type source region N+ may be located in body region Pbody, and the source region can be electrically connected to source electrode Source. In semiconductor device 200, the reduced surface field effect layer may be a P-type buried layer PBL, in order to ensure that the first spacing distance is greater than or equal to the second spacing distance, and in a first direction (e.g., a stacking direction of the reduced surface field effect layer and the drift region), the junction depth of the drift region is less than the junction depth of the body region.

With continued reference to FIG. 2, semiconductor device 200 may also include a first dielectric layer, a first conductor, and voltage withstanding layer. The first dielectric layer may be located on a first surface of the base layer and adjacent to the source region, the first conductor can be located on the first dielectric layer, the voltage withstanding layer may be located between the first dielectric layer and the drain region, and a portion of the first conductor may be located on the withstand voltage layer. In semiconductor device 200, the first dielectric layer can serve as a gate dielectric layer, and the first conductor can be a gate conductor for electrically connecting gate electrode Gate. The first dielectric layer may be an oxide layer (e.g., a SiO2 layer), and the first conductor may be polysilicon layer Poly1 covering the first dielectric layer and extending to a surface of a portion of the withstand voltage layer.

The voltage withstanding layer may be a LOCOS dielectric layer (e.g., thick oxide layer Oxide), and thick oxide layer Oxide may be a bird's beak shape, where the thickness of the LOCOS dielectric layer is greater than the thickness of the first dielectric layer. The second spacing distance may be set to be less than the first spacing distance to better assist in depleting the bird's beak region, to reduce the electric field of the bird's beak region, and to improve the hot carrier characteristics of the device. In addition, as shown in FIG. 2, a body contact region can be located in the body region, the body contact region may have the same doped type as the body region (e.g., a body contact region P+ is P-type doped), and the body contact region can be in contact with the source region and connected to the same potential as the source region (e.g., all of them are electrically connected with source electrode Source).

Figure 3:
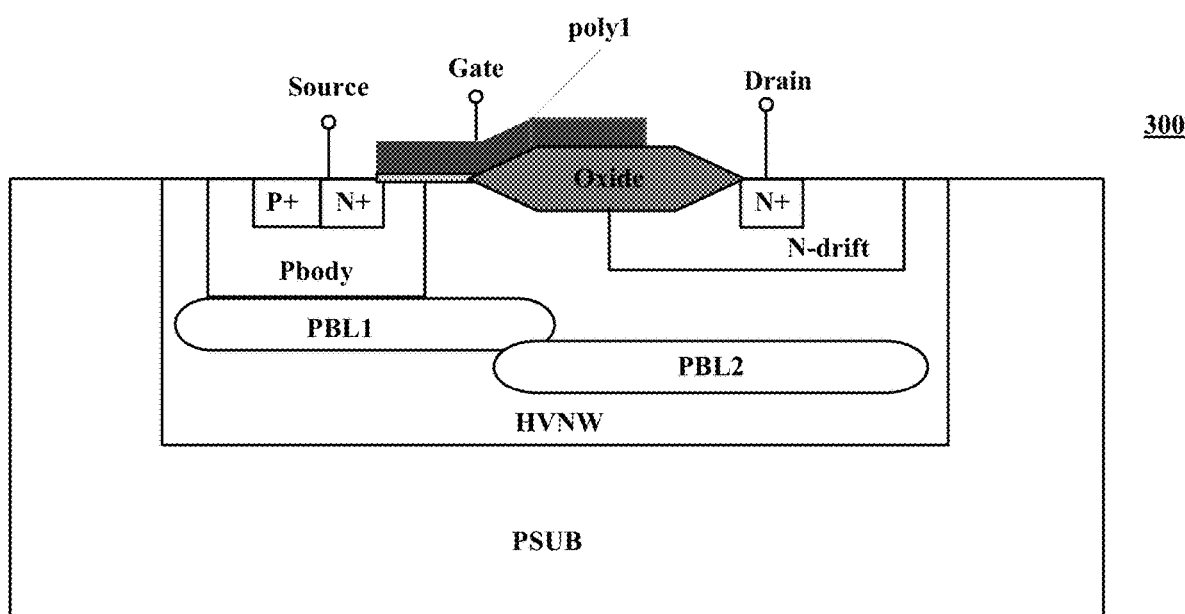
FIG. 3 is a cross-sectional view of a second example laterally diffused metal oxide semiconductor device, in accordance with embodiments of the present invention.

Referring now to FIG. 3, shown is a cross-sectional view of a second example laterally diffused metal oxide semiconductor device, in accordance with embodiments of the present invention. In this particular example, in semiconductor device 300, the spacing distance between the first surface of the reduced surface field effect layer (the side close to the drift region) and the first surface of the base layer is not constant value, whereby the upper surface of the reduced surface field effect layer located below the body region is closer to the top surface of the base layer than an upper surface of the reduced surface field effect layer located below the drift region. For example, the third spacing distance between the upper surface of the reduced surface field effect layer located below the body region and the top surface of the base layer may be less than a fourth spacing between the upper surface of the reduced surface field effect layer located below the drift region and the top surface of the base layer. The reduced surface field effect layer located below the body region can be as close as possible to the body region to reduce the surface electric field and improve the breakdown voltage of semiconductor device 300. There can be a space between the reduced surface field effect layer located below the drift region and the drift region to reduce on-resistance of semiconductor device 300 by the greatest extent.

In semiconductor device 300, the reduced surface field effect layer may be composed of first and second buried layers located in the base layer, where the first and second buried layers are in contact with each other. At least a portion of the first buried layer can be located below the body region, and at least a portion of the second buried layer can be located below the drift region. Also, a spacing distance between a upper surface of the first buried layer and the top surface of the base layer is a third spacing distance, and a spacing distance between a upper surface of the second buried layer and the top surface of the base layer is a fourth spacing distance. The first buried layer can be a P-type buried layer PBL1, and the second buried layer can be a P-type buried layer PBL2, where first buried layer PBL1 may be disposed as close as possible to the P-type body region Pbody. For example, first buried layer PBL1 and P-type body region Pbody can be directly in contact. A voltage of the source electrode applied to body region Pbody (e.g., the reference ground voltage) may be applied to PBL1 through the Pbody to avoid dynamic Rdson from occurring. Second buried layer PBL2 may not be in contact with drift region N-drift; that is, the first spacing distance can be greater than zero, to provide a wider current path for the electrons, and to further reduce the Rdson of semiconductor device 300.

Figure 4:
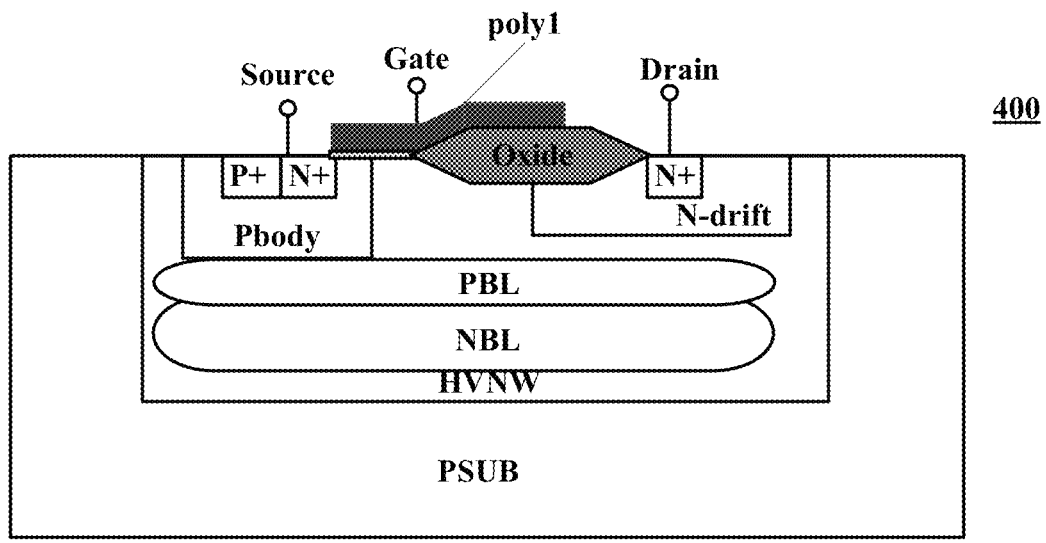
FIG. 4 is a cross-sectional view of a third example laterally diffused metal oxide semiconductor device, in accordance with embodiments of the present invention.

Referring now to FIG. 4, shown is a cross-sectional view of a third example laterally diffused metal oxide semiconductor device, in accordance with embodiments of the present invention. In this particular example, semiconductor device 400 may also include an isolation layer located in the base layer and below the reduced surface field effect layer. The isolation layer can isolate the reduced surface field effect layer from the base layer to facilitate high voltage application of semiconductor device 400. In this example, the isolation layer may be third buried layer NBL of the N-type doped located in high voltage well HVNW and located below buried layer PBL, and the doping concentration of the third buried layer NBL can be greater than that of the high voltage well HVNW. Similarly, the isolation layer described in semiconductor device 400 may also be disposed below the reduced surface field effect layer in example semiconductor device 300.

Figure 5:
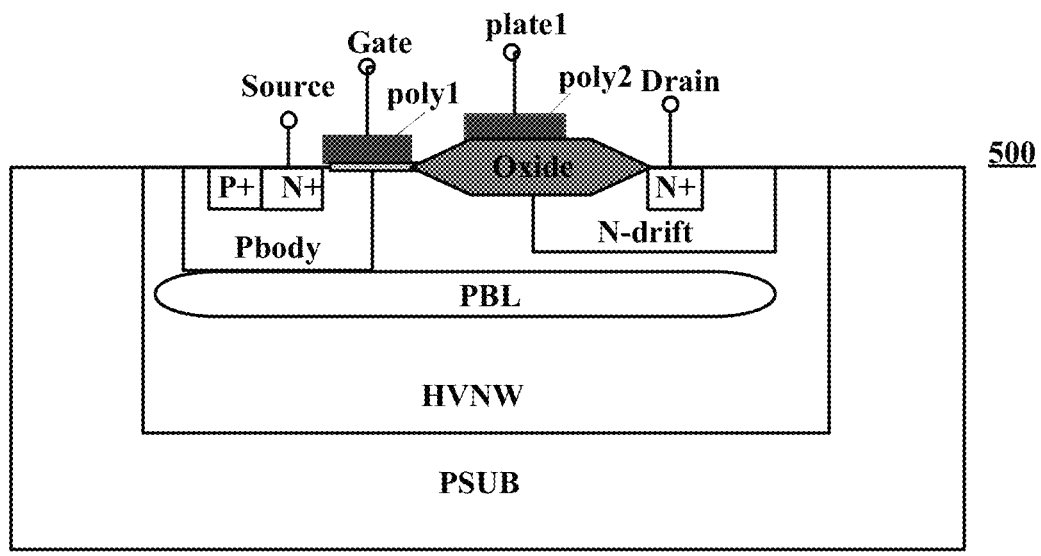
FIG. 5 is a cross-sectional view of a fourth example laterally diffused metal oxide semiconductor device, in accordance with embodiments of the present invention.

Referring now to FIG. 5, shown is a cross-sectional view of a fourth example laterally diffused metal oxide semiconductor device, in accordance with embodiments of the present invention. In this particular example, semiconductor device 200 may also include a second conductor. The second conductor may only be located on the thick oxide layer Oxide, and the first conductor can be only located on the first dielectric layer. The first and second conductors may be spatially isolated, whereby the spatial isolation is that the first and second conductors are not in contact with each other in a spatial position and are spaced apart from each other.

As shown in FIG. 5, the first conductor may be polysilicon poly1, and the second conductor may be polysilicon Poly2. Polysilicon Poly1 can be electrically connected to gate electrode Gate, and polysilicon Poly2 can be electrically connected to first field plate electrode Plate1. First field plate electrode Plate1 can be connected to the same potential as source electrode Source. That is, the first field plate electrode Plate1 may be electrically connected to source electrode Source, and/or first field plate electrode Plate1 may be connected to other potentials separately, and first field plate electrode Plate1 can be connected to a different potential from gate electrode Gate. Because first field plate electrode Plate1 and gate electrode Gate can be connected to different potentials, when the potential connected to the gate electrode Gate causes semiconductor device 500 to be in an off state, first field plate electrode Plate1 can still assist in depleting the drift region by receiving a certain potential, in order to maintain the high voltage withstanding of semiconductor device 500. In addition, since the first conductor may be fully located on the first dielectric layer such that an overlapping portion between the first conductor and the drain portion (a region where the drain region is located) becomes relatively small, gate charge Qgd can be greatly reduced, such that semiconductor device 500 can be used in a high frequency field. The structures of the first and second conductors in semiconductor device 500 may also be employed in semiconductor devices 300 and 400.

Figure 6:
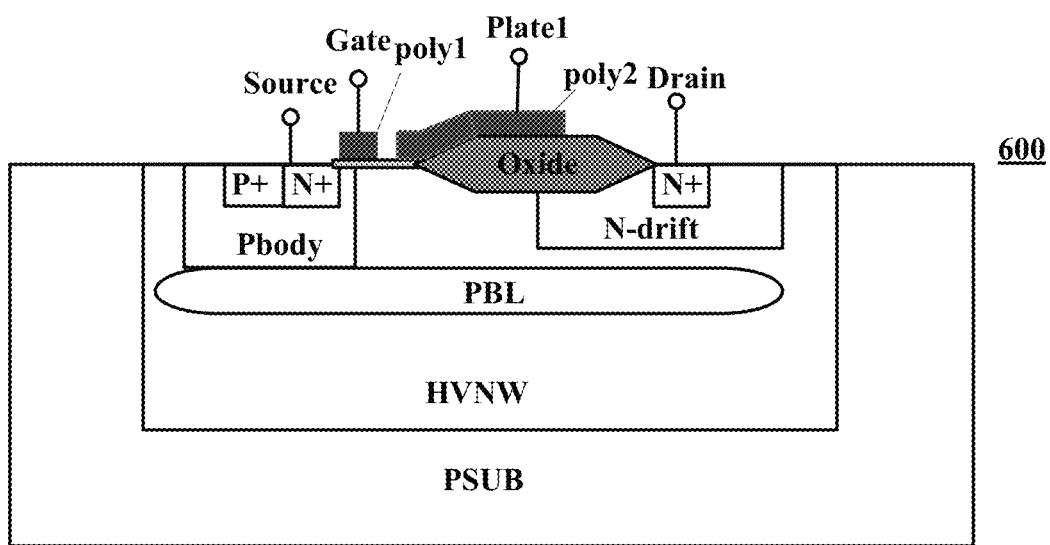
FIG. 6 is a cross-sectional view of a fifth example laterally diffused metal oxide semiconductor device, in accordance with embodiments of the present invention.

Referring now to FIG. 6, shown is a cross-sectional view of a fifth example laterally diffused metal oxide semiconductor device, in accordance with embodiments of the present invention. In this particular example, in semiconductor device 600, polysilicon Poly2 may not only be located on thick oxide layer Oxide, but also can be located on the first dielectric layer. For example, polysilicon Poly2 may extend from a portion of the first dielectric layer to thick oxide layer Oxide, such that polysilicon Poly2 overlies the juncture region between the first dielectric layer and thick oxide layer Oxide, in order to effectively reduce gate charge Qgd of semiconductor device 600. Similarly, the first and second conductor structures in FIG. 6 may also be employed in semiconductor devices 300 and 400.

Figure 7:
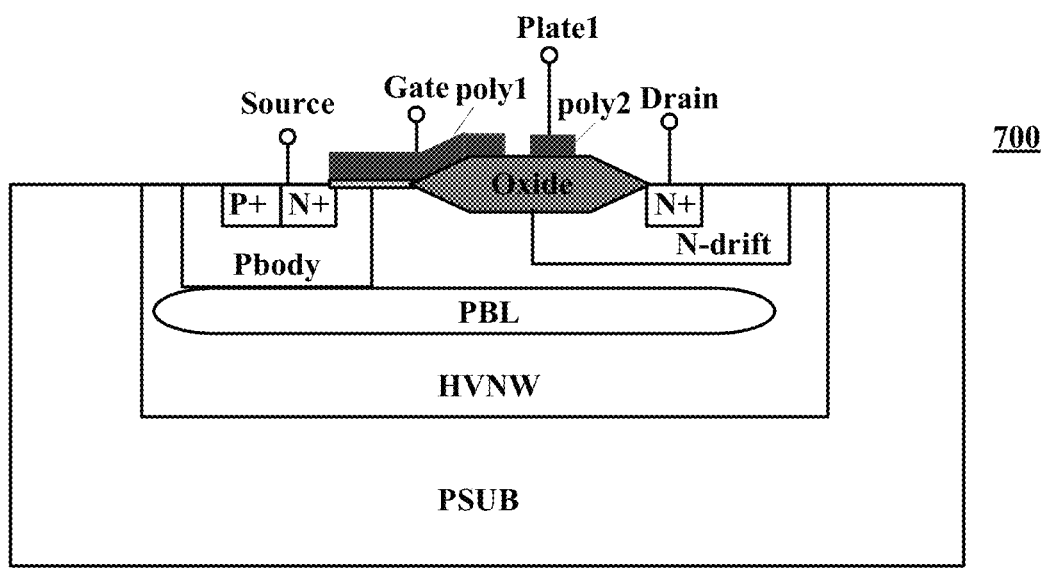
FIG. 7 is a cross-sectional view of a sixth example laterally diffused metal oxide semiconductor device, in accordance with embodiments of the present invention.

Referring now to FIG. 7, shown is a cross-sectional view of a sixth example laterally diffused metal oxide semiconductor device, in accordance with embodiments of the present invention. In this particular example, in semiconductor device 700, polysilicon Poly1 may not only be located on the first dielectric layer, but also can be located on thick oxide layer Oxide. For example, polysilicon Poly1 may extend from the first dielectric layer to thick oxide layer Oxide, such that polysilicon Poly1 overlies the juncture between the first dielectric layer and thick oxide layer Oxide, in order to effectively reduce gate charge GQ of semiconductor device 700. Similarly, the first and second conductor structures in FIG. 7 may also be employed in semiconductor devices 300 and 400.

Figure 8:
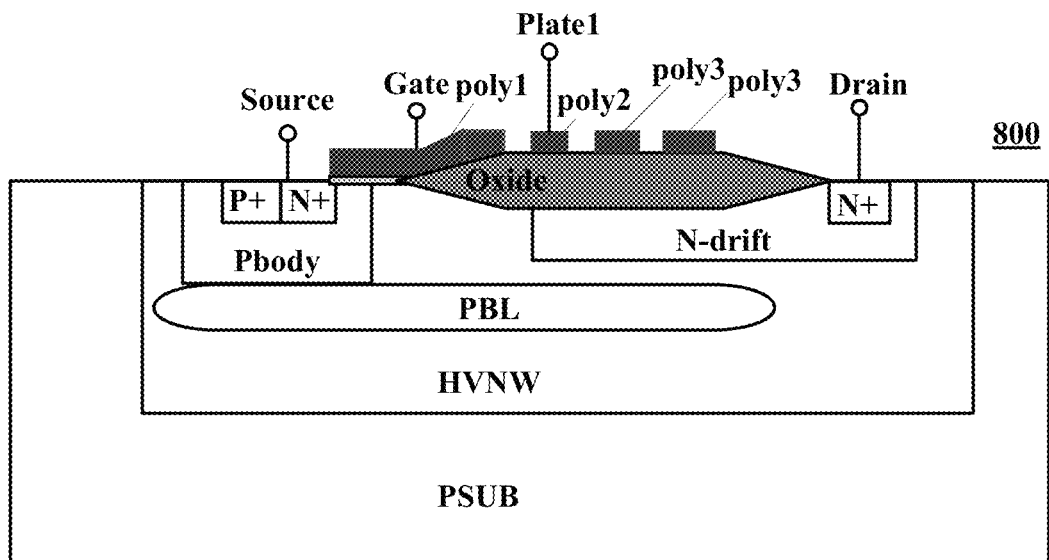
FIG. 8 is a cross-sectional view of a seventh example laterally diffused metal oxide semiconductor device, in accordance with embodiments of the present invention.

Referring now to FIG. 8, shown is a cross-sectional view of a seventh example laterally diffused metal oxide semiconductor device, in accordance with embodiments of the present invention. In this particular example, semiconductor device 800 may also include at least one third conductor. Each of the third conductors can be located on thick oxide layer Oxide and spatially isolated from each other, where the third conductor adjacent to the second conductor may be spatially isolated from the second conductor. In semiconductor device 800, the third conductor layer may be polysilicon Poly3, and each of polysilicon Poly3 can be electrically connected to corresponding second field plate electrodes. Also, the potential of each of the second field plate electrodes may be different from that of first field plate Plate1. The closer the polysilicon Poly3 is to the drain region N+, the higher potential of the second field plate electrically connected to the polysilicon Poly3 is, and the voltage withstanding performance of the device can be further improved. In addition, a resistor may be disposed between second field plate electrode adjacent to first field plate electrode and first field plate electrode Plate1, or/and a resistor may be disposed between the adjacent second field plate electrodes. Similarly, structures of the first, second, and third conductors in FIG. 8 can also be employed in semiconductor devices 300 and 400.

Figure 9:
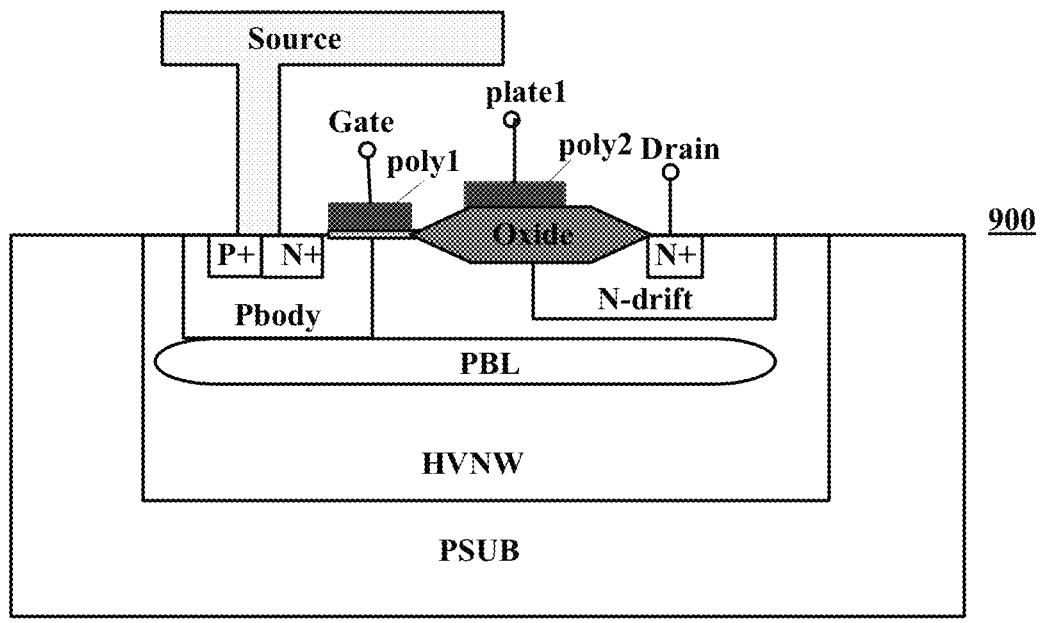
FIG. 9 is a cross-sectional view of an eighth example laterally diffused metal oxide semiconductor device, in accordance with embodiments of the present invention.

Referring now to FIG. 9, shown is a cross-sectional view of an eighth example laterally diffused metal oxide semiconductor device, in accordance with embodiments of the present invention. In this particular example, source electrode Source can be electrically connected to the source region, and may extend to above at least a portion of the second conductor (polysilicon Poly2) such that the first dielectric layer and/or the thick oxide layer Oxide located between the first and second conductors can be covered by the source electrode Source. That is, the disconnected position between the first and second conductors can be covered by the source electrode Source. It should be noted that the coverage herein does not necessarily mean that source electrode Source is directly in contact with first dielectric layer and/or the voltage-withstanding layer, but rather is a non-contact covering, such as source electrode Source being located above the first dielectric layer and/or the voltage-withstanding layer. The electric field at the disconnected position of the first and second conductors may drop, and in semiconductor device 900, the disconnected position can be covered by the source electrode Source without contact to avoid the dropping phenomenon, thereby improving the voltage withstanding performance of semiconductor device 900. Similarly, the source electrode structure in semiconductor device 900 can be employed in example semiconductor devices 600, 700, and 800.

In particular embodiments, a method of manufacturing a laterally diffused metal oxide semiconductor device can be provided, and may include forming a reduced surface field effect layer having a first doping type in a predetermined region of a base layer, forming a drift region having second doping type in the base layer, and forming a drain region having a second doping type in the drift region. Along a depth direction from the top surface of the base layer to a bottom surface of the base layer, a lower surface of the drift region may not be lower than the upper surface of the reduced surface field effect layer. For example, the drift region can be located above the reduced surface field effect layer, and a first spacing distance between the lower surface of the drift region and the upper surface of the reduced surface field effect layer may be greater than zero. That is, the lower surface of the body region may not be in contact with the upper surface of the reduced surface field effect layer.

As shown in FIG. 8, semiconductor device 800 can be formed according to the example manufacturing method, whereby high voltage well region HVNW may be formed in semiconductor substrate PSUB, and base layer can include high voltage well region HVNW and semiconductor substrate PSUB. A field oxide layer may then be formed using a Local Oxidation of Silicon process, and thick oxide layer Oxide is formed using the Local Oxidation of Silicon (LOCOS) process after limiting the high-voltage drain region with a mask, and the drift region and the reduced surface field effect layer can be formed. Further, after forming the reduced surface field effect layer, an isolation layer, such as an NBL layer (see, e.g., FIG. 3), can be formed in the base layer, and the isolation layer may be located below the reduced surface the field effect layer to isolate the reduced surface field effect layer from the base layer.

A method of manufacturing a semiconductor device in particular embodiments can include forming a first dielectric layer, as shown in FIGS. 2-9. That is, a gate dielectric layer can be formed, and then a conductor layer (e.g., a polysilicon layer) may be deposited on the first dielectric layer and thick oxide layer Oxide, and the deposited conductor layer may be etched to form first, second, and third conductors. For example, the first dielectric layer may be adjacent to the source region. After forming the first and second conductors, the method can include forming a body region (e.g., a Pbody region) in each of FIGS. 2-9, and a lightly doped drain (LDD) region can be formed in the body region by an implanting process. For example, an n-type lightly doped region NLDD region may be formed in the Pbody body region. Along a depth direction from the top surface of the base layer to a bottom surface of the base layer, a lower surface of the body region may not be lower than the upper surface of the reduced surface field effect layer, and the second spacing distance between the lower surface of the body region and the upper surface of the reduced surface field effect layer may be less than or equal to the first spacing distance. For example, an upper surface of the reduced surface field effect layer located below the body region can be closer to the top surface of the well region than an upper surface of the reduced surface field effect layer located below the drift region.

After forming the body region and the lightly doped region, sidewalls can be formed at the side surface of the first, second, and/or third conductors shown in FIGS. 2-9. Further, a source region and a drain region may respectively be formed in the body region and the drift region, and a source electrode, a drain electrode, a gate electrode, and field plate electrodes can be formed. When the source electrode is formed, the source electrode may extend at least to above the second conductor. In addition, when forming the reduced surface field effect layer, the first spacing distance may be adjusted according to the doping concentration of the drift region. For example, the higher the doping concentration of the drift region, the lower the first spacing distance. In addition, a reduced surface field effect layer may be formed having two P-type buried layers (see, e.g., FIG. 3) by using two masks, thereby a third spacing distance between the reduced surface field effect layer located below the body region and the first surface of the base layer may be less than a fourth spacing distance between the reduced surface field effect layer located below the drift region and the first surface of the base layer.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of manufacturing a laterally diffused metal oxide semiconductor device, the method comprising:
   a) providing a substrate;
   b) forming a well region of a second doping type extending from a top surface of the substrate into the substrate;
   c) forming an insulating structure in a predetermined region of the well region, wherein at least a portion of the insulating structure is located on a top surface of the well region;
   d) forming a reduced surface field effect layer of a first doping type by an implantation process in a predetermined region in the well region, wherein a length of the reduced surface field effect layer is less than a length of the well region, neither side surface of the reduced surface field effect layer is in alignment with a side surface of the well region, a lower surface of the reduced surface field effect layer is not in contact with a bottom surface of the well region, and an upper surface of the reduced surface field effect layer is lower than a top surface of the well region;
   e) forming a body region of the first doping type extending from a top surface of the well region into the well region by an implantation process, in a predetermined region of the well region; and
   f) forming a drain portion of the a second doping type extending from a top surface of the well region into the well region by an implantation process, in a predetermined region in the well region,
   g) wherein the insulating structure is located between the body region and the drain portion along a depth direction from the top surface of the well region to a bottom surface of the well region, and a lower surface of the body region and a lower surface of the drain portion is not lower than the upper surface of the reduced surface field effect layer, wherein the reduced surface field effect layer is disposed below all of the drain portion along the depth direction.

2. The method according to claim 1, wherein the reduced surface field effect layer is disposed below a drain contact in the drain portion along the depth direction.

3. The method according to claim 2, wherein the reduced surface field effect layer is disposed below the body region along the depth direction.

4. The method according to claim 2, wherein the lower surface of the drain portion is not in contact with the upper surface of the reduced surface field effect layer.

5. The method according to claim 1, further comprising:
 a) providing a substrate having the first doping type, wherein the well region is located in the substrate;
 b) forming a source region of the second doping type extending from the top surface of the well region into the body region;
 c) forming a body contact region of the first doping type extending from the top surface of the well region into the body region; and
 d) forming a drift region of the second doping type extending from the top surface of the well region into the well region,
 e) wherein the drain portion comprises the drift region of the second doping type, and a drain region of the second doping type located in the drift region.

6. The method according to claim 5, wherein the forming the insulating structure comprises:
 a) forming a first dielectric layer located on the top surface of the well region, wherein the first dielectric layer is adjacent to a source region; and
 b) forming a local oxidation of silicon (LOCOS) dielectric layer located the top surface of the well region and between the first dielectric layer and a drain region,
 c) wherein the insulating structure comprises the first dielectric layer and the LOCOS dielectric layer.

7. The method according to claim 6, further comprising forming a first conductor layer at least partially located on the first dielectric layer and a second conductor at least partially located the LOCOS dielectric layer, wherein the first and second conductors are spatially isolated.

8. The method according to claim 7, further comprising forming a source electrode electrically connected to the source region, wherein the source electrode extends to at least to above the second conductor.

9. The method according to claim 6, wherein a thickness of the LOCOS dielectric layer is greater than a thickness of the first dielectric layer.

10. The method according to claim 5, wherein the greater the doping concentration of the drift region, the closer the upper surface of the reduced surface field effect layer is to the lower surface of the drain region.

11. The method according to claim 1, wherein the reduced surface field effect layer is not in lateral contact with regions having the first doping type.

12. The method according to claim 1, wherein the reduced surface field effect layer does not have openings.

* * * * *